US006801468B1

United States Patent
Lee

(10) Patent No.: US 6,801,468 B1
(45) Date of Patent: Oct. 5, 2004

(54) PSEUDO STATIC RAM CAPABLE OF PERFORMING PAGE WRITE MODE

(75) Inventor: Jung Seop Lee, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/429,344

(22) Filed: May 5, 2003

(30) Foreign Application Priority Data

Jun. 28, 2002 (KR) .................................. 10-2002-36707

(51) Int. Cl.[7] .................................................. G11C 7/00
(52) U.S. Cl. ................ 365/222; 365/233.5; 365/230.08
(58) Field of Search ............................. 365/222, 233.5, 365/230.08, 235, 230, 193

(56) References Cited

U.S. PATENT DOCUMENTS

| 4,184,208 | A | | 1/1980 | Tubbs |
| 4,549,284 | A | | 10/1985 | Ikuzaki |
| 5,033,026 | A | | 7/1991 | Tsujimoto |
| 5,075,886 | A | | 12/1991 | Isobe et al. |
| 5,206,830 | A | | 4/1993 | Isobe et al. |
| 5,301,164 | A | | 4/1994 | Miyawaki |
| 6,023,440 | A | * | 2/2000 | Kotani et al. .......... 365/230.03 |
| 6,285,578 | B1 | | 9/2001 | Huang |
| 6,625,079 | B2 | * | 9/2003 | Yahata et al. ................ 365/222 |

FOREIGN PATENT DOCUMENTS

| JP | 60020396 | 2/1985 |
| JP | 63155495 | 6/1988 |
| JP | 2101692 | 4/1990 |
| JP | 4026986 | 1/1992 |
| JP | 7220469 | 8/1995 |

* cited by examiner

Primary Examiner—Thong Q. Le
(74) Attorney, Agent, or Firm—Ladas & Parry LLP

(57) ABSTRACT

A pseudo SRAM capable of performing a page write mode is disclosed. The pseudo SRAM performs a page write according to a specified edge of a write command signal in a state that a word line is continuously activated without an intermediate pre-charge after one row activation in a column address corresponding to a predetermined page width. Then, the pseudo SRAM internally performs a self-refresh according to its characteristics. If a refresh request signal precedes a write command, it terminates the refresh, and if the pre-charge is operated, it performs a write operation. If the refresh request signal follows the write command, it terminates the write mode by releasing the chip select, and if the pre-charge is operated, it performs the refresh operation. Also, since the cell data may be lost if the page write is performed for a long time and thus the internal refresh cannot be performed, it keeps a period in which the chip is not selected as long as a read cycle time so that the refresh can be performed in the middle of the write operation if the long write time is longer than a refresh time period. Thus, the write operation in the pseudo SRAM can be performed at a high speed.

20 Claims, 19 Drawing Sheets

FIG.6B

| OP0 | OP1 | OP2 | MODE |
|-----|-----|-----|------|
| VSS | X | X | page<1> |
| VCC | VSS | VSS | page<2> |
| VCC | VCC | VSS | page<4> |
| VCC | VSS | VCC | page<8> |
| VCC | VCC | VCC | page<F> |

PSEUDO STATIC RAM CAPABLE OF PERFORMING PAGE WRITE MODE

BACKGROUND OF THE INVENTION

1. Field of the Invention

The present invention relates to a pseudo static RAM (SRAM), and more particularly to a pseudo SRAM and a method for operating the same that can perform a page write mode.

2. Description of the Prior Art

As generally known in the art, a RAM (random access memory) among semiconductor memories is a memory in which random access to any storage is possible and both write and read of information can be performed, and is widely used as a memory of a computer or a peripheral terminal. The RAM has the advantage of low cost, small size, lower power consumption, high-speed call, non-destructive decoding, etc., but has the disadvantage that if a power is gone, all data stored are erased. There are two kinds of RAMs. One is a dynamic RAM that keeps hold of information by a refresh operation at predetermined intervals in a power-on state. The other is a static RAM that keeps hold of information if only the power is on.

A memory that loses information if the power is off is called a volatile memory, while a memory that does not lose information even if the power is off such as a ROM (read only memory) is called a non-volatile memory. The static RAM has the advantage that it can be easily connected to other integrated circuits, but requires three or four times as many as the number of elements of the dynamic RAM for the same storage capacity, so that its construction is complicated with a high cost in comparison to the dynamic RAM.

Currently, researches for a so-called pseudo SRAM that implements the same operation as the static RAM using cells of the dynamic RAM have actively been in progress. The pseudo static RAM has the advantage that its chip size is reduced in comparison to existing SRAMs to achieve a high-level integration of 16 Mbits, 32 Mbits, 64 Mbits, etc. However, since the cell of the pseudo SRAM has the same structure as those of the dynamic RAM, the refresh operation should be performed therein.

The memory technology has been developed with two brief purposes. One is to heighten the degree of integration and to provide a mass storage device. The other is to improve the speed of data read from a memory and/or of data write into the memory. The pseudo SRAM that implements the operation of the SRAM using the cells of the dynamic RAM originates in efforts for storing larger-capacity data than the existing SRAM, but the present invention is derived from efforts for performing a write operation at a higher speed than the existing pseudo SRAM.

Up to the present, the pseudo SRAM can perform only a signal write mode for writing data only in a column after activating on a row, but cannot perform a so-called page write mode for continuously writing data in many column without an intermediate pre-charge operation. FIG. 1 is a timing diagram illustrating the operation of the conventional pseudo SRAM that performs the single write mode. In FIG. 1, waveforms of external signals are shown. '/CS' denotes a chip select signal, 'A0~Am' a column address signal, 'Am+1~An" a row address signal, '/WE' a write enable signal, '/LB' and '/UB' are lower and upper block control signals, 'DIN' a data signal inputted to the pseudo SRAM, and 'DOUT' a data signal outputted from the SRAM, respectively. In a typical pseudo SRAM, there is no distinction between the column address signal and the external address signal. For convenience' sake in explanation, they will be explained in distinction from each other.

In FIG. 1, the AC characteristics of the conventional pseudo SRAM are also defined. In FIG. 1, 'tWC' denotes a time required from a chip select to a write end, 'tWC' a write cycle time, and 'tAW' a time required from reception of an effective address signal to a write end. Also, 'tAS' denotes an address setup time, 'tWP' a write pulse width, 'tWR' a write restoration time, and 'tBW' a time required from reception of an effective block control signal to a write end. Also, 'tDW' denotes a time required from a data reception to a write end, 'tDH' a data hold time in a write operation, 'tWHZ' a time when high impedance is outputted from a write start, and 'tOW' is a time required from a write end to output activation. A shaded portion in the chip select signal /CS and the block control signals /LB and /UB represents a don't care signal, and an oblique-line portion in the output data signal DOUT represents invalid data. Also, 'H-Z' in the input data DIN and in the output data DOUT represents a high-impedance state.

As shown in FIG. 1, in the conventional single write mode, since the write operation is performed with respect to only one column according to row activation for once, it is difficult to perform a high-speed write operation. That is, according to the existing single write mode, in which for each write command, the row activation is performed and data is written in cells of the corresponding column, the row activation is performed again even if the same address as the row address previously activated is continuously inputted, and thus the high-speed write operation cannot be performed. Accordingly, it is necessary to implement a page write mode in which the write operation is continuously performed with respect to several columns corresponding to a previously set page width among the corresponding columns by one row-activation operation.

However, as described above, since the pseudo SRAM uses the cells of the dynamic RAM, the refresh should be performed at predetermined intervals, and at the same time since the pseudo SRAM operates in the same manner as other SRAMs, it should send and receive a command signal, data signal, address signal, etc., in the same manner (i.e., protocol) as other SRAMs. In the single write mode, the refresh does not matter in particular since the time required for the write operation is not so long, but in the page write mode, the write operation should be performed for a long time without an intermediate refresh operation, and thus data may be lost during the page write mode in the pseudo SRAM using the dynamic RAM. Accordingly, in order to perform the page write mode in the pseudo SRAM, it is essential to properly perform the refresh operation in relation to the page write operation.

SUMMARY OF THE INVENTION

Accordingly, the present invention has been made to solve the above-mentioned problems occurring in the prior art, and an object of the present invention is to provide a pseudo SRAM that can implement a page write mode even using cells of dynamic RAM.

Another object of the present invention is to provide a method of performing a page write mode in a pseudo SRAM using cells of a dynamic RAM.

In order to accomplish this object, there is provided a pseudo SRAM having a new structure. The pseudo SRAM according to the present invention performs a page write according to a specified edge of a write command signal in a state that a word line is continuously activated without an intermediate pre-charge after one row activation in a column address corresponding to a predetermined page width. Then, the pseudo SRAM internally performs a self-refresh according to its characteristics. If a refresh request signal precedes a write command, it terminates the refresh, and if the pre-charge signal is generated, it performs a write operation. To prepare for the worst, it makes the minimum value of tCW, tWC, tAW, and tBW larger than the sum of a refresh cycle time and a single write cycle time. If the refresh request time follows the write command, it terminates the write mode by releasing the chip select, and if the pre-charge signal is generated, it performs the refresh operation. Also, since the cell data may be lost if the page write is performed for a long time and thus the internal refresh cannot be performed, it keeps a period in which the chip is not selected as long as a read cycle time (hereinafter, referred to as "tRC") so that the refresh can be performed in the middle of the write operation if the page-write time is longer than a refresh time period tREF. The refresh time period tREF is a time period obtained by dividing the whole retention time by the whole number of rows. According to the present invention, the write operation in the pseudo SRAM can be performed at a high speed.

In one aspect of the present invention, there is provided a pseudo SRAM that includes a memory cell array composed of cells of a dynamic RAM, a buffer enable block for receiving an external chip select signal and generating a buffer enable signal and an internal chip select signal, and a write enable signal buffer section for receiving an external write enable signal and generating a write command signal. The pseudo SRAM is also provided with a page width setup section for generating a page width select signal according to a set page width, a refresh control section for performing a refresh of the memory cell array by generating a refresh request signal at predetermined refresh intervals, and a page address strobe signal generating section for generating a page address strobe signal in case that the write command signal has a specified transition at a pre-chargeable time point after a row activation of the cell array. The pseudo SRAM is also provided with a data buffer section for receiving an external data signal if the buffer enable signal is received and generating an internal data signal, an address buffer section for receiving an external address signal if the buffer enable signal is received and generating an internal address signal, latching the internal address signal according to the page address strobe signal, and generating no address transition detection signal if the generated internal address signal is within the page width according to the page width select signal, while generating an address transition detection signal if the generated internal address signal is outside the page width, an input/output control section for receiving the internal address signal, the internal data signal, the write command signal, the internal chip select signal, the refresh request signal, and the page width select signal, the input/output control section, if the internal address signal corresponds to the page width according to the page width select signal, controlling the refresh control section so that the refresh operation is not performed as keeping the specified row activation state of the memory cell array activated by the previous address signal, and performing a page write operation for writing the internal data signal in columns of the memory cell array corresponding to the internal address signal according to the transition of the write command signal, and a pre-charge control section for pre-charging the input/output control section if the address transition detection signal is received.

In another aspect of the present invention, there is provided a method of performing a method of performing a page write mode in a pseudo SRAM having a memory cell array composed of cells of a dynamic RAM, comprising a first step of first performing a refresh operation of the memory cell array, and then performing a write operation if generation of a refresh request signal precedes generation of a write command signal, and a second step of first performing the write operation of the memory cell array, and then performing the refresh operation if the generation of the write command signal precedes the generation of the refresh request signal.

The write operation may includes a first substep of first writing one-bit data in a corresponding cell after performing activation of a specified row of the memory cell array by the write command signal, a second substep of writing the data in the cell corresponding to a next address signal as keeping the activation state of the activated row if a next address signal received from the outside is within a predetermined page width, and a third substep of writing the corresponding data by activating the row of the memory cell array corresponding to the next address after performing the refresh operation of the memory cell array if the next address is outside the page width. It is determined that a time required for the first substep is larger than a sum of a refresh cycle time and a single write cycle time. The second substep is continuously performed only for a time smaller than the refresh period.

BRIEF DESCRIPTION OF THE DRAWINGS

The above and other objects, features and advantages of the present invention will be more apparent from the following detailed description taken in conjunction with the accompanying drawings, in which:

FIGS. 6A and 6B illustrate a circuit diagram of an example of a page width setup section illustrated in FIG. 3 and a logic table thereof.

DETAILED DESCRIPTION OF THE PREFERRED EMBODIMENT

Figure 1:
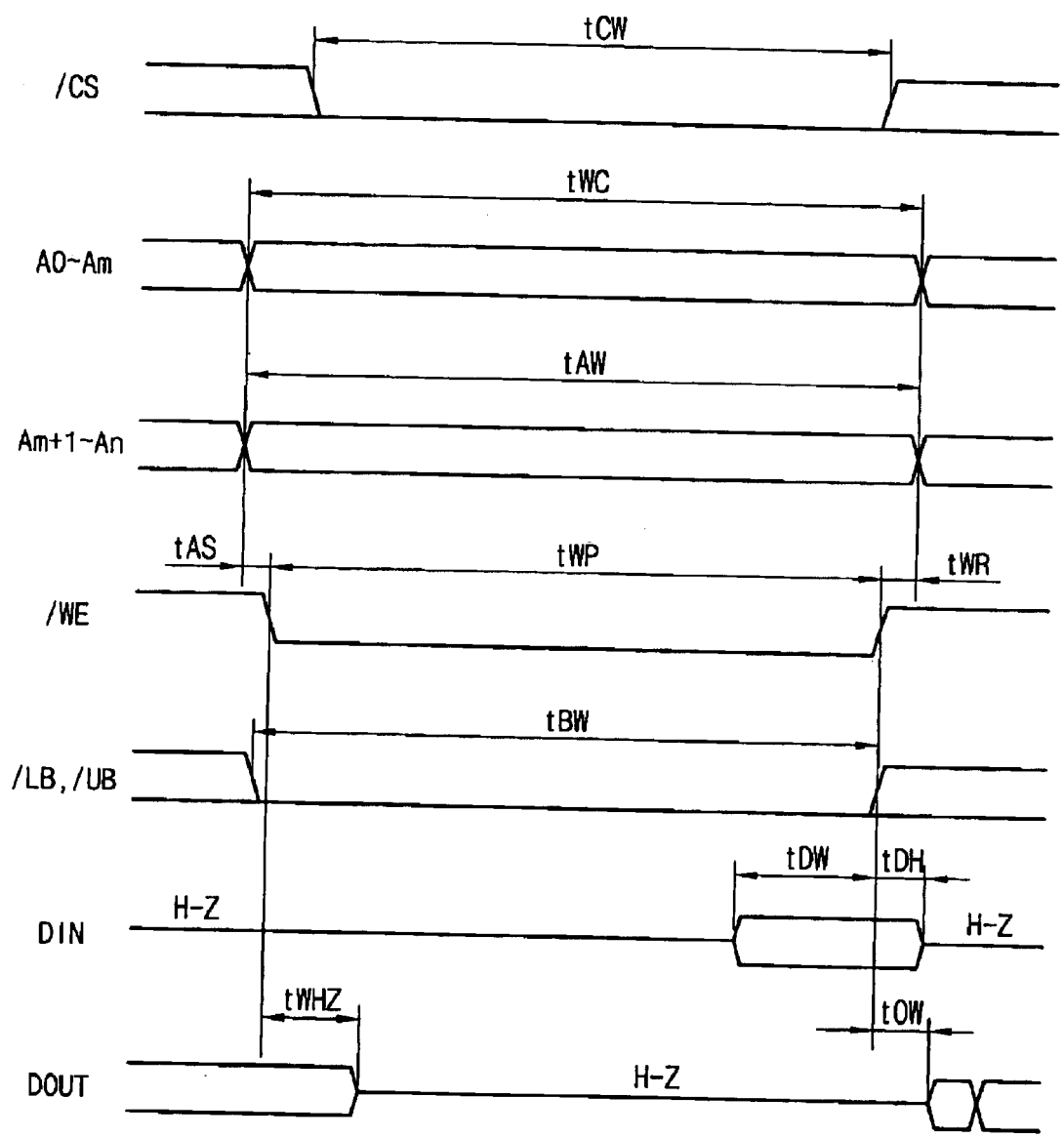
FIG. 1 is a signal waveform diagram explaining a single write mode in a conventional pseudo SRAM.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
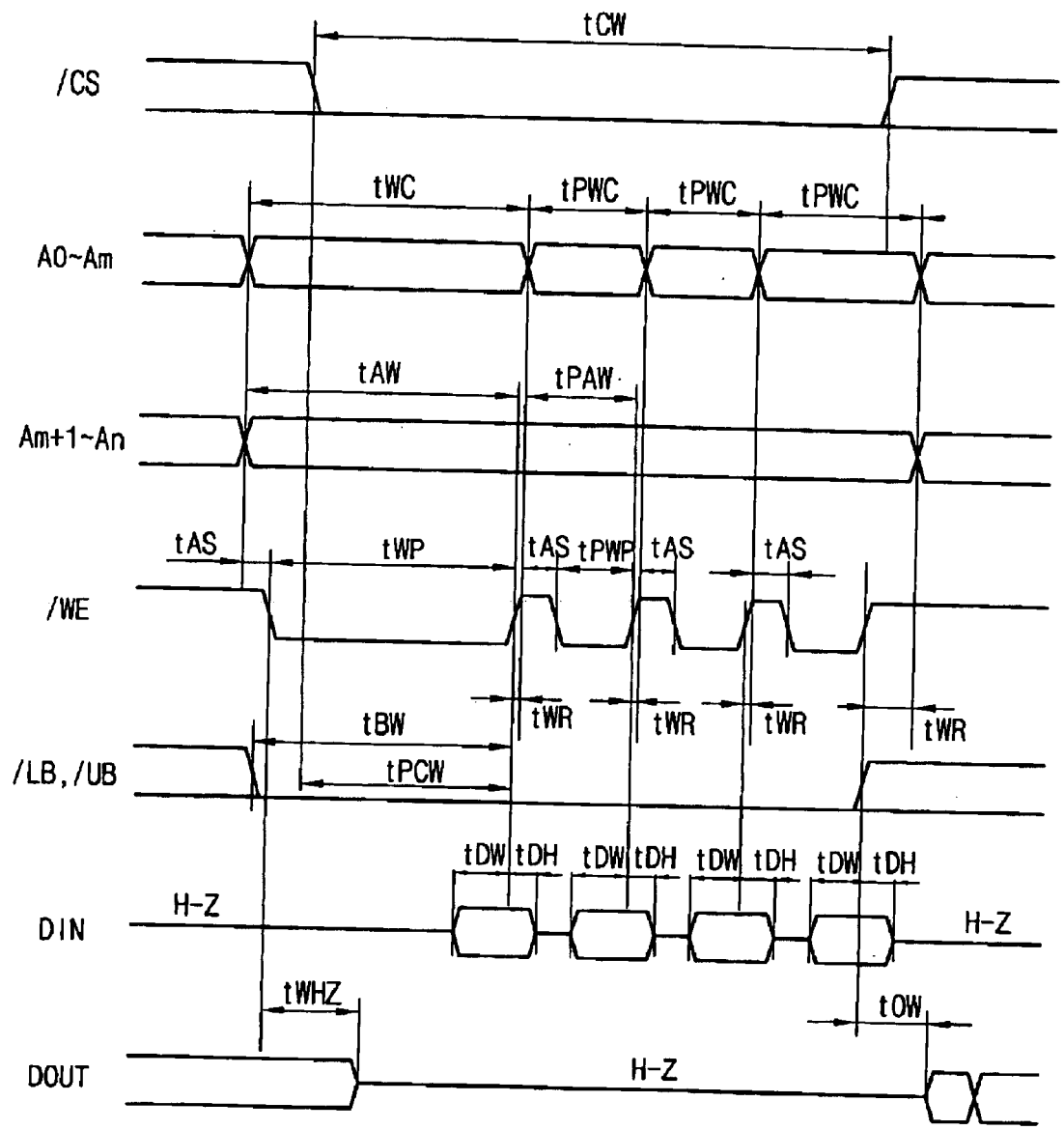
FIG. 2 is a signal waveform diagram explaining a page write mode in a pseudo SRAM according to the present invention.

FIG. 2 is a signal waveform diagram explaining a page write mode in a pseudo SRAM according to the present invention. In FIG. 2, waveforms of external signals are shown. In the same manner as FIG. 1, '/CS' denotes a chip select signal, 'A0~Am' a column address signal, 'Am+1~An" a row address signal, '/WE' a write enable signal, '/LB' and '/UB' are lower and upper block control signals, 'DIN' a data signal inputted to the pseudo SRAM, and 'DOUT' a data signal outputted from the pseudo SRAM, respectively.

In FIG. 2, in addition to the conventional AC characteristics of the SRAM as illustrated in FIG. 1, parameters tPWC, tPCW, tPAW, and tPWP are additionally defined as new DC characteristics for a page write mode according to the present invention. 'tPWC' denotes a page mode write cycle time, and in case that the next address is an address within a predetermined page width (hereinafter, referred to as "page address"), it indicates a cycle time required for the data write. Meanwhile, in case that the write operation is first performed by a write command, the write cycle time is tWC and should include a time for activating the row, and thus, a time longer than tPWC is required. Also, 'tPCW' denotes a time required from chip selection to page address transition, and indicates a time required for writing data in a first page address after the chip select signal /CS becomes low. Meanwhile, 'tCW' indicates a time required for completing the write operation after the chip select signal /CS becomes low. 'tCW' in the existing SRAM has the same value as 'tPCW' of the present invention. In the present invention, 'tCW' has 'tPCW' as its minimum value, and has a refresh period (tREF) as its maximum value. 'tPAW' denotes a time required from reception of an effective address signal to a write end, and indicates a time required for data write after a second page address is transited. Meanwhile, 'tAW' indicates a time required for data write performed by the first address. Also, 'tPWP' is a page mode write pulse width, and indicates the pulse width of the write enable signal /WE during the writing operation by the page address. Remaining parameters are the same as those defined in FIG. 1.

Figure 3A:
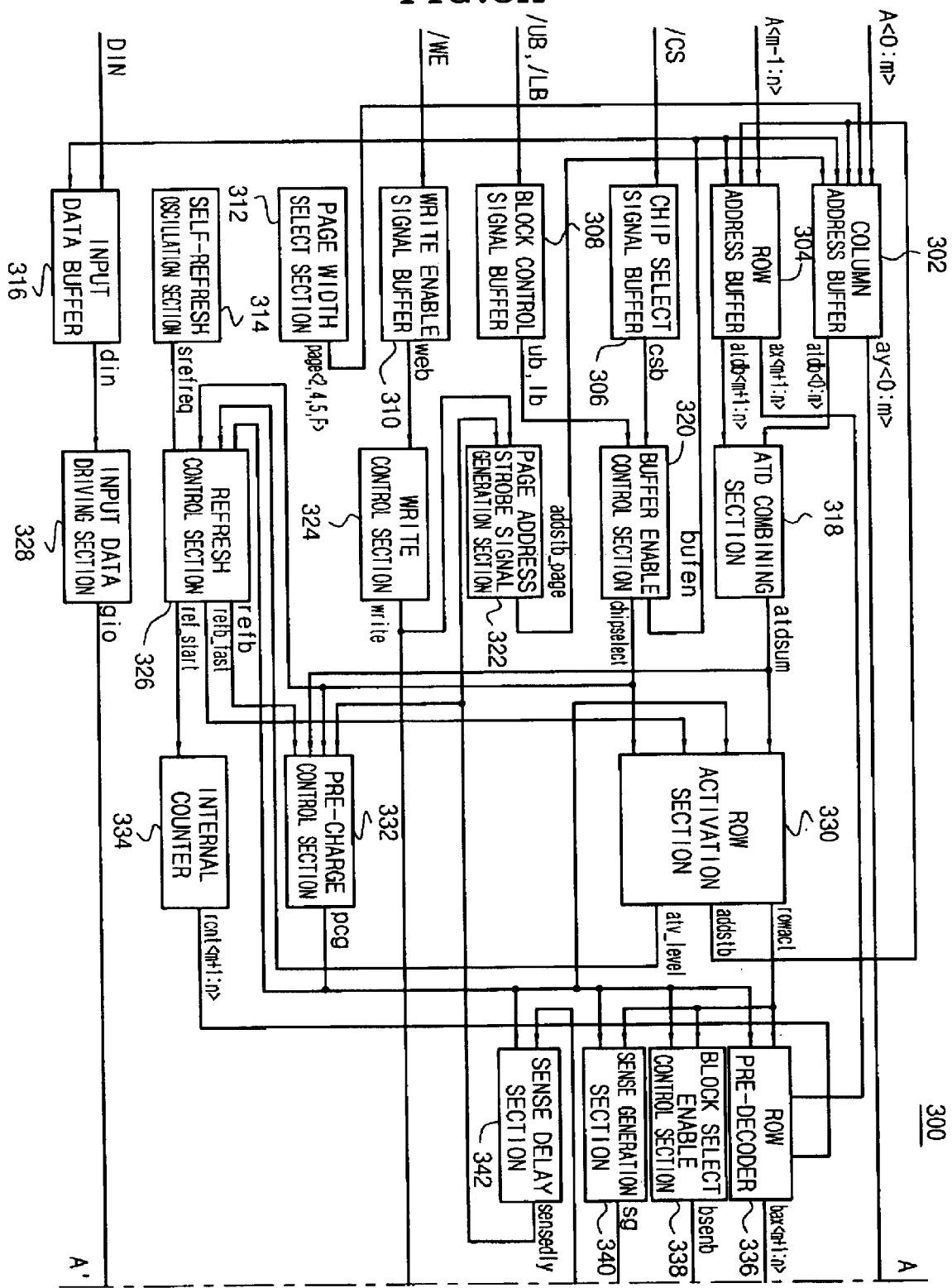
FIGS. 3A and 3B illustrate a block diagram of a pseudo SRAM according to an embodiment of the invention.
Figure 3B:
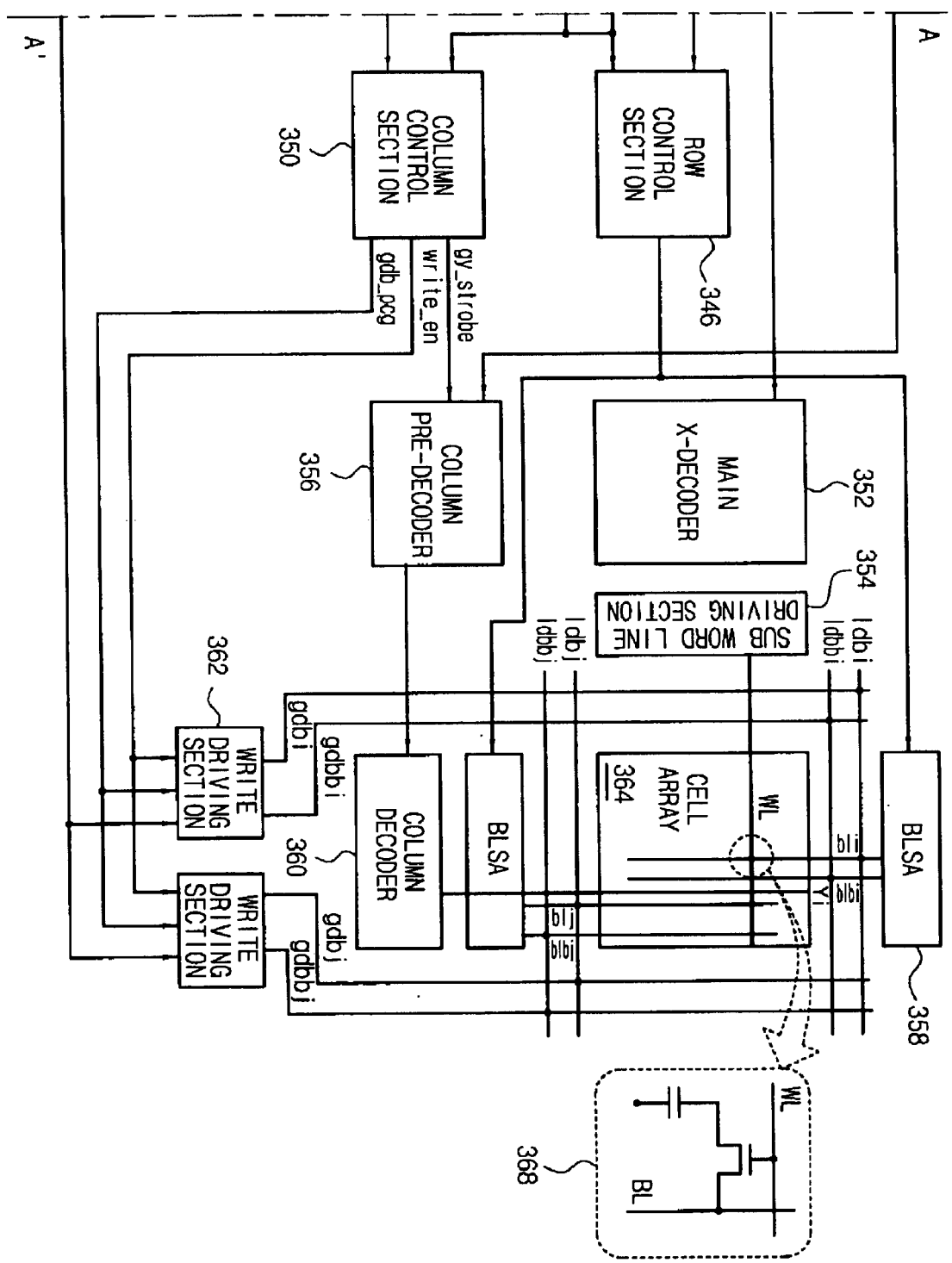

FIG. 3 illustrate a block diagram of a pseudo SRAM 300 according to an embodiment of the present invention.

The pseudo SRAM 300 has a new construction of a column address buffer 302, page width selection section 312, page address strobe signal generation section 322, and refresh control section 326 in comparison to the existing pseudo SRAM. In FIG. 3, the construction and operation of a row address buffer 304, chip select signal buffer 306, block control signal buffer 308, write enable signal buffer 310, self-refresh oscillation section 314, input data buffer section 316, ATD combining section 318, buffer enable control section 320, write control section 324, input data driving section 328, row activation section 330, pre-charge control section 332, internal counter 334, row pre-decoder 336, block selection enable control section 338, sense generation section 340, sense delay section 342, row control section 346, column control section 350, main X decoder 352, sub word line driving section 354, column pre-decoder 356, bit line sense amplifier 358, column decoder 360, write driving section 362, cell array 364, etc., are the same as those of the existing pseudo SRAM. Thus, the detailed explanation thereof will be omitted, and only a portion related to the present invention will now be explained. As shown in FIG. 3, a memory cell 368, which constitutes a cell array 364, is composed of one MOS transistor and one capacitor in the same manner as the typical dynamic RAM.

First, the column address buffer 302 receives column address of 0 to m. If /CS, or /UB and /LB becomes low, and a chip is selected, the buffer enable control section 320 outputs a high-level buffer enable signal bufen, and thus the column address buffer 302 is enabled to receive a column address A<0:m> from the outside. If the page address strobe signal generation section 322 outputs a high-level page address strobe signal addstb_page, the column address buffer 302 latches the externally received column address signal A<0:m> onto an internal column address signal ay<0:m>. Also, the column address buffer 302 has an address transition detection block (not illustrated) for detecting the change of the external address, and outputs an address transition detection signal atdb<0:m>. The column address buffer 302 also receives an output page<2,4,8,F> of the page width selection section 312, and selects signals to be sent to the address transition detection signal combining section 318. The row address buffer 304 refers to the row address, and receives an address strobe signal instead of the page address strobe signal addstb_page in distinction from the column address buffer 302. The address strobe signal addstb is made by the row activation section 330, which is somewhat faster than a row activation signal rowact. That is because since it takes time for the external row address A<m+1;n> to be latched onto the row address buffer 304 by the address strobe signal addstb and to reach the row pre-decoder 336, the row activation signal rowact reaches the row pre-decoder 336 with some margins to perform a normal row pre-decoding.

The buffer enable control signal 320 produces the buffer enable signal bufen and an internal chip select signal chipselect, and when /CS, or /UB and /LB is in a low level, it produces the buffer enable signal as well as the internal chip select signal chipselect. With the input of the internal chip select signal and the address transition detection combining signal atdsum outputted from the ATD combining section 318, the row activation section 330 produces the row activation signal rowact. If the chip select signal chipselect is inputted to the row activation section 330 faster than a signal refb_fast, the row activation signal is enabled, and if the pre-charge signal pcg is inputted thereafter, the refresh start signal ref_start is also inputted. The pre-charge control section 332 enables the pre-charge signal pcg if the chip select signal chipselect is low or the address transition detection combining signal is inputted, and a sense delay signal sensedly for informing a pre-chargeable time point is inputted after the row activation.

The row control section 346 receives a block selection enable signal bsenb and a signal sg for informing a time point for sensing, and controls the bit line sense amplifier 358. The main X decoder 352 and the sub word line driving section 354 enable the word line WL using a signal bax<m+

1:n> decoded in the row pre-decoder 336. The write control section 324 produces the write command signal using the internal write enable signal web through the write enable signal buffer 310, and the page address strobe signal generation section 322 receives the write command signal and the sense delay signal, and produces the page address strobe signal addstb_page. The column control section 350 receives the write command signal and the signal sg outputted from the sense generation section 340, and produces a signal gy_strobe. This signal gy_strobe makes the internal column address signal ay<0:m> pre-decoded in the column pre-decoder 356, and thus makes the column select signal Yi produced through the column decoder 360.

The self-refresh request signal srefreq outputted at predetermined intervals through the self-refresh oscillation section 314 makes the refresh control section 326 produce the refresh start signal ref_start. The internal counter 334 receives the refresh start signal ref_start, and produces and provides a signal rcnt<m+1:n> to the row pre-decoder 336. Accordingly, the SRAM 300 performs the refresh operation with respect to the corresponding row.

Figure 4:
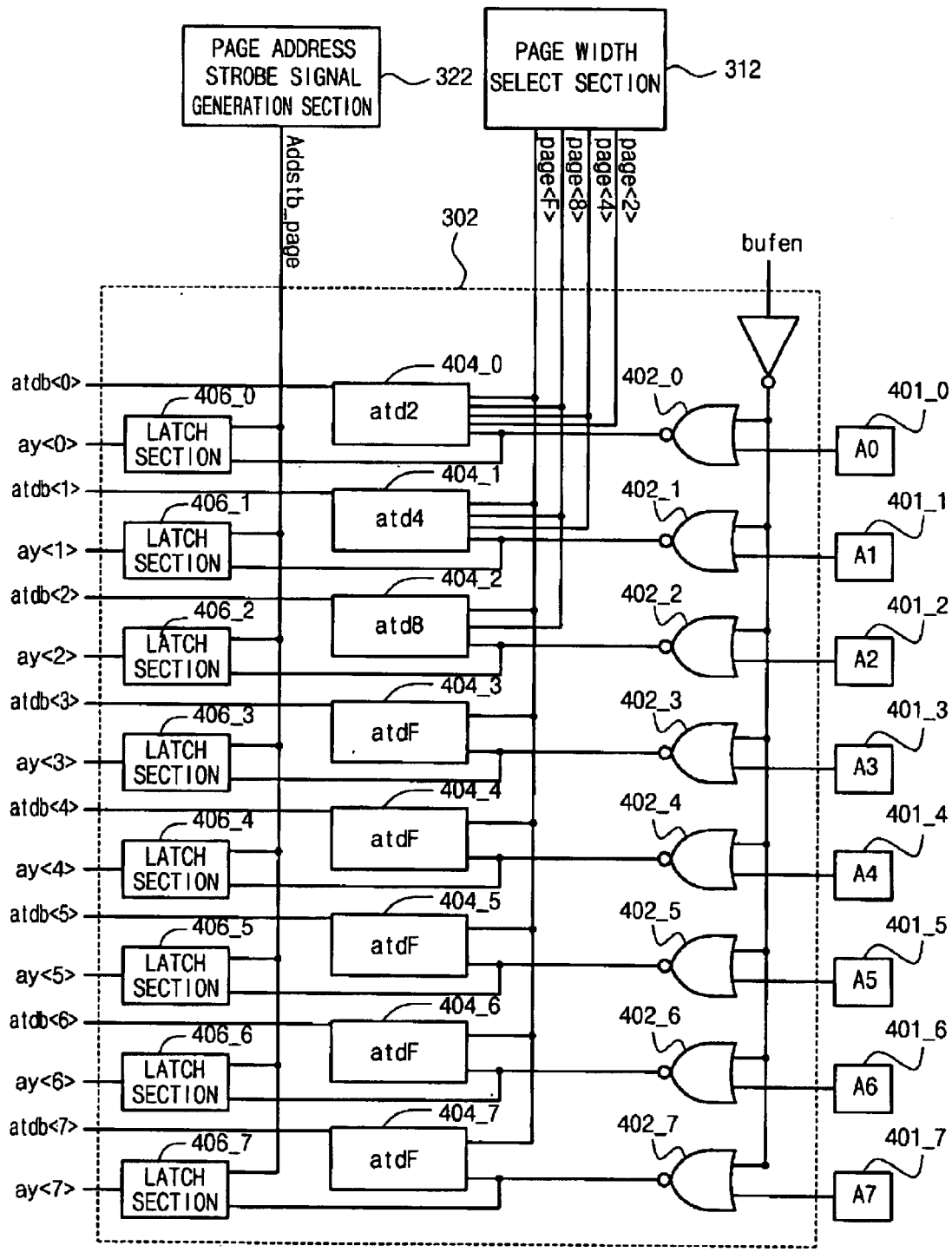
FIG. 4 is a circuit diagram of an example of a column address buffer illustrated in DIG. 3.

FIG. 4 is a circuit diagram of an example of the column address buffer 302 illustrated in FIG. 3. A 8-bit column address is exemplified in FIG. 4. When the buffer enable signal bufen is in a high level, NOR gates 402_0, ..., 402_7 receive the external address signal A0, ..., A7 provided through pads 401_0, ..., 401_7, and address transition detection blocks 404_0, ..., 404_7 produce the address transition detection signals atdb<0:7>. At this time, all the address transition detection blocks 404_0, ..., 404_7 do not operate, but only the address transition detection blocks selected through the page width selection section 312 operate. That is, if a signal page<2> is enabled by the page width selection section 312, only the address transition detection block 404_0 does not operate, and outputs a high level signal, so that the pre-charge is not performed. If a signal page<4> is enabled, the address transition detection blocks 404_0 and 404_1 do not operate, and thus the pre-charge is not performed even though the address signal A0 and A1 is changed. If a signal page<8> is enabled, the address transition detection blocks 404_0, 404_1, and 404_2 do not operate, and thus the pre-charge is not performed even though the address signal A0, A1 and A2 is changed. If a signal page<F> is enabled, all the address transition detection blocks 404_0, ..., 404_7 do not operate, and thus the pre-charge is performed only if the row address is changed. If the output signal addstb_page of the page address strobe signal generation section 322 becomes high, latch sections 406_0, ..., 406_7 latch output signals of NOR gates 402_0, ..., 402_7 by an internal address signal ay<o:7>. The address transition detection signal atdb<0:7> is a pulse signal whose activation state corresponds to a low level, but the activation state of the address transition detection signal may be made so as to correspond to a high level.

Figure 5A:
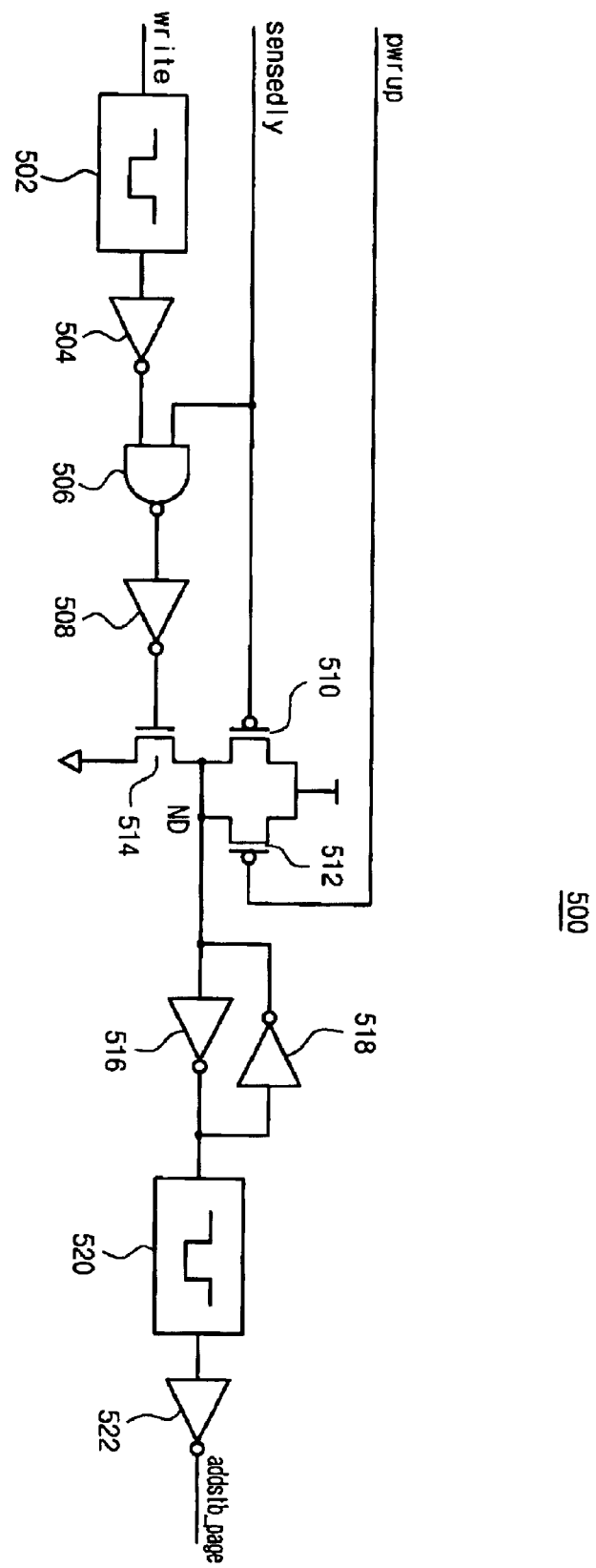
FIGS. 5A and 5B illustrate a circuit diagram of a page address strobe signal generating section illustrated in FIG. 3 and a signal waveform diagram thereof.
Figure 5B:
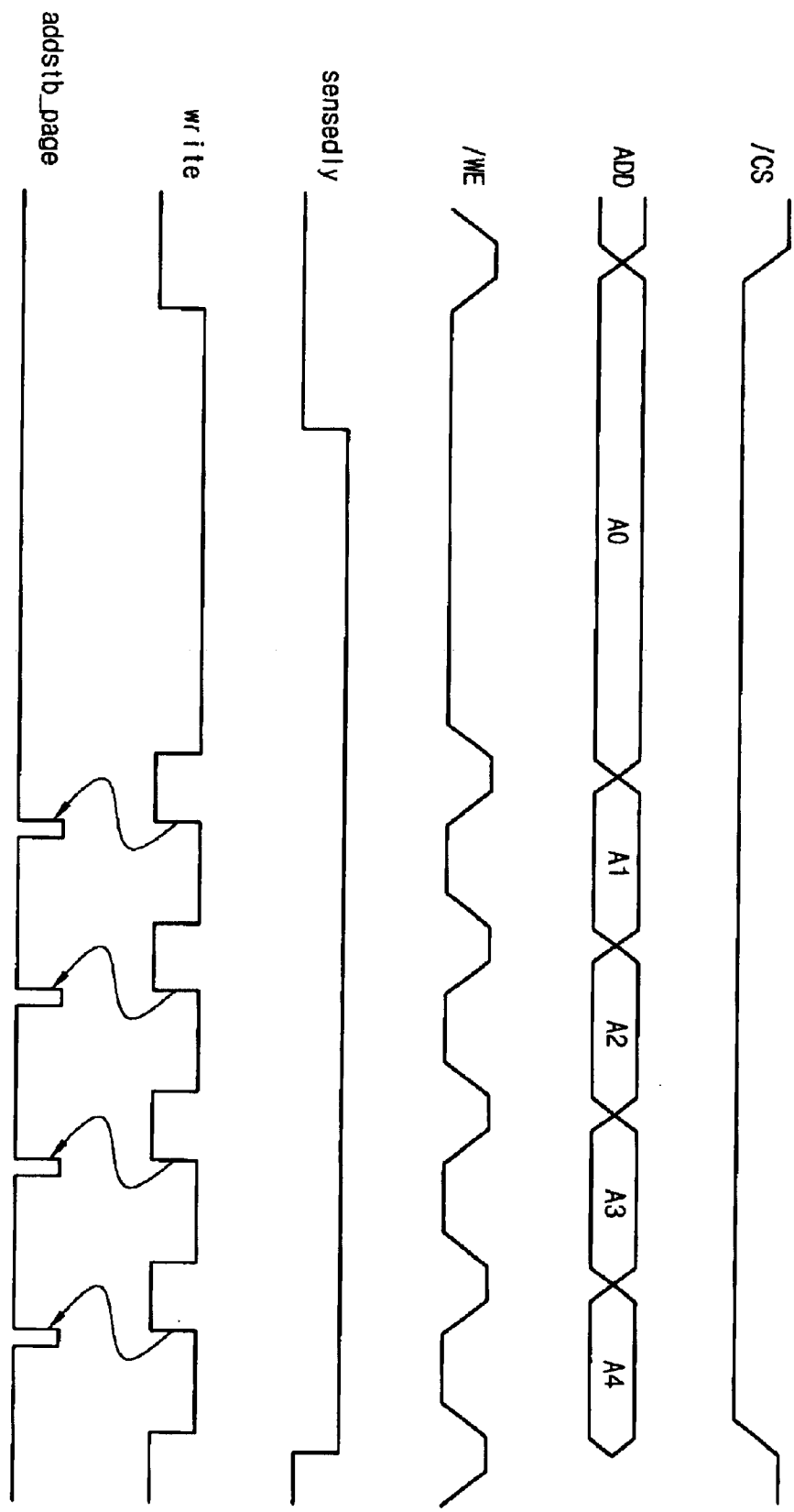

FIG. 5A is a circuit diagram of an example of the page address strobe signal generating section illustrated in FIG. 3, and FIG. 5B is a signal waveform diagram thereof. As shown in FIG. 5A, the page address strobe signal generation section 500 may be implemented by low pulse generation sections 502 and 520, inverters 504, 508, 516, 518 and 522, a NAND gate 506, PMOS transistors 510 and 512, and an NMOS transistor 514. The low pulse generation sections 502 and 520, if their input signals are activated, generate pulse signals having a low level. In FIG. 5A, 'pwrup' denotes a power-up signal that is a low pulse signal generated when the power supplied to the SRAM is stabilized, and initializes a node ND as a high level. The sense delay signal is a signal generated from the sense delay section (342 in FIG. 3) which becomes high at a time point at which the pre-charge operation is performed after completion of sensing by a bit-line sense amplifier (358 in FIG. 2).

If the write command signal goes from a low level to a high level after the sense delay signal became a high level, the page address strobe signal generation section 500 generates a signal addstb_page in the form of a pulse. Meanwhile, the sense delay signal and the write command signal are asynchronous from each other, and this may cause a glitch to occur in the page address strobe signal generation section 500 conventionally. Accordingly, as shown in FIG. 5A, the page address strobe signal generation section 500 according to the present invention is implemented to make a pulse once more by a latch operation even if the glitch is inputted. Through this operation, an accurate latch operation can be performed at any time.

Figure 6A:
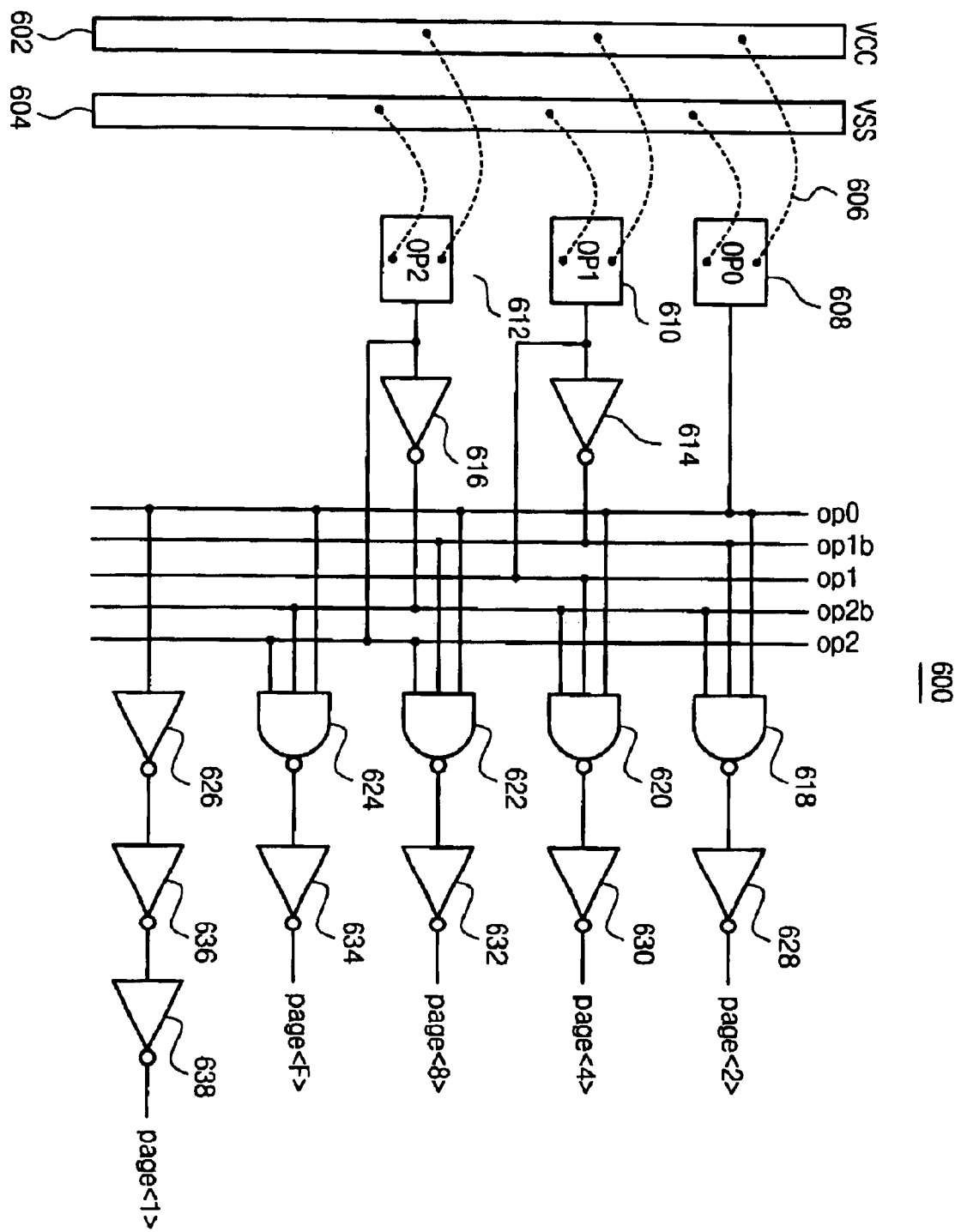

FIG. 6A is a circuit diagram of an example of the page width setup section illustrated in FIG. 3, and FIG. 6B is a logic table thereof. As shown in FIG. 6A, a page width setup section 600 generates a page width select signal page<1,2,4,8,F> as shown in FIG. 6B using bonding wires between lead frames 602 and 604 and option pads 608, 610 and 612.

In FIG. 6A, to the lead frame 602 is applied a power supply voltage VCC, and to the lead frame 604 is applied a ground voltage VSS. The option pads 608, 610 and 612 are selectively connected to the lead frame 602 or lead frame 604 through the bonding wire 606. If it is assumed that the option pads 608 and 610 are connected to the lead frame 602 and the option pad 612 are connected to the lead frame 604, an inverter 614 outputs a low level, and an inverter 616 outputs a high level. Accordingly, since a high level is applied to lines op0, op1 and op2, and a low level is applied to lines op1b and op2, NAND gates 618, 622 and 624 output a high level, and only NAND gate 620 outputs a low level. Inverters 628, 630, 632 and 634 invert output signals of the NAND gates 618, 620, 622 and 624, and output a high-level signal page<4> and a low-level signal page<2,8,F>. In this case, the SRAM according to the present invention operates in a mode where the page width is 4. Meanwhile, the option pad 608 is connected to the lead frame 604 by the bonding wire, and if the ground voltage is applied to the option pad 608, an inverter 634 outputs a low level, and an inverter 638 outputs a high-level signal page<1>. In this case, the SRAM according to the present invention operates in a single write mode, i.e., a mode where the page width is 1.

Figure 7A:
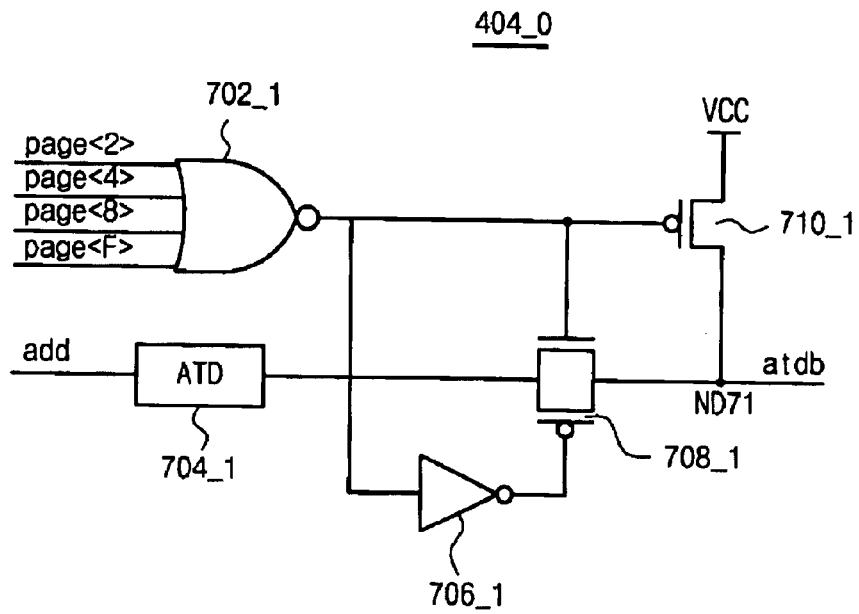
FIGS. 7A to 7D illustrate a circuit diagram of examples of an address transition detection block.
Figure 7B:
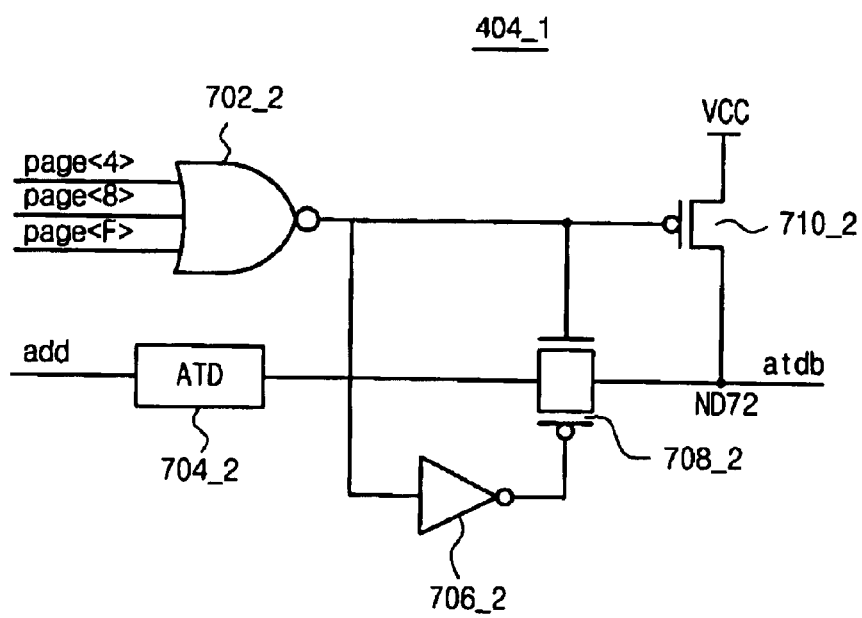
Figure 7C:
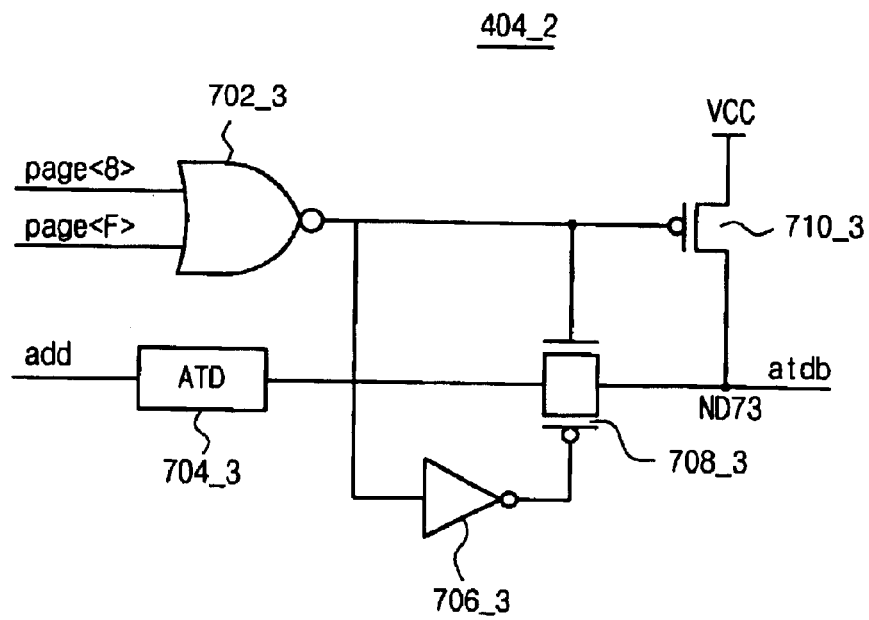
Figure 7D:
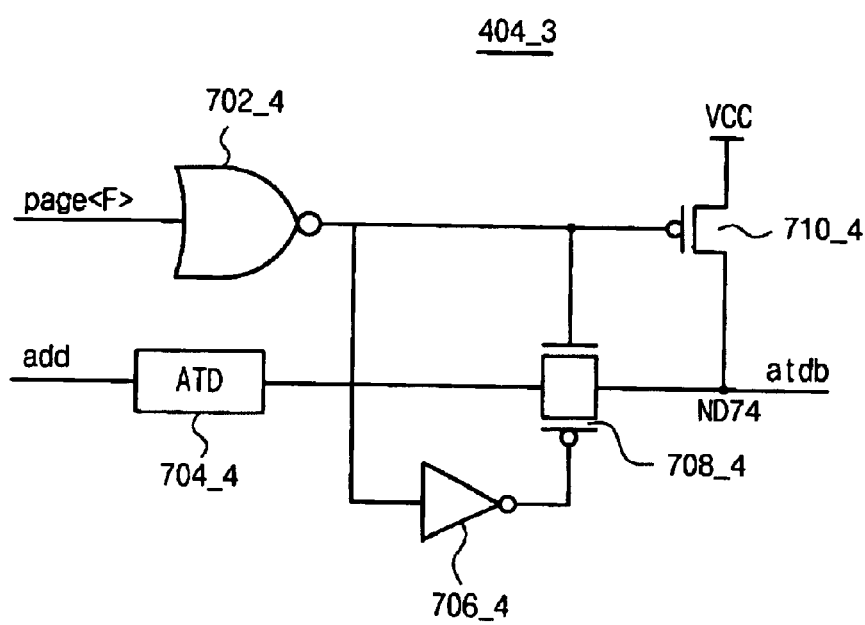

FIGS. 7A to 7D illustrate a circuit diagram of examples of the address transition detection block controlled by the page width select signal page<2,4,8,F>. FIG. 7A shows the address transition detection block 404_0 of FIG. 4, FIG. 7B shows the address transition detection block 404_1, FIG. 7C shows the address transition detection block 404_2, and FIG. 7D shows the address transition detection block 404_3. As shown in FIGS. 7A to 7D, the address transition detection blocks 404_1, 404_2, 404_3 and 404_4 may include NOR gates 702_1, 702_2, 702_3 and 702_4, address transition detectors 704_1, 704_2, 704_3 and 704_4, inverters 706_1, 706_2, 706_3 and 706_4, pass gates 708_1, 708_2, 708_3 and 708_4, and PMOS transistors 710_1, 710_2, 710_3 and 710_4. The address transition detectors 704_1, 704_2, 704_3 and 704_4 are devices that generate high-level or low-level pulses if signals applied to their input terminals are transited from a high level to a low level, or from a low level to a high level.

First, the operation of the address transition detection block 404_1 will be explained. NOR gate 702_1 receives the page width select signal page<2,4,8,F> as its input, and if any element of the page width select signal is in a high level, NOR gate outputs a low level. In this case, PMOS transistor 710_1 is turned on, and outputs a high level to a node ND71. Meanwhile, if all elements of the page width select signal are in a low level, NOR gate 702_1 outputs a high level, and this causes PMOS transistor 710_1 to be turned off and the pass gate 708_1 to be turned on. Accordingly, the signal outputted from the address transition detector 704_1 is outputted through the node ND71 as an address transition detection signal atdb. In the address transition detection block 404_2, the page width select signal page<4,8,F> is used as the input of NOR gate 702_2, and if any of elements page<4>, page<8> and page<F> of the page width select signals is in a high level, a high level is outputted to a node ND72, while if all elements page<4>, page<8> and page<F> of the page width select signal are in a low level, the signal outputted from the address transition detector 704_2 is outputted through the node ND72 as an address transition detection signal atdb. In the address transition detection block 404_3, the page width select signal page<8,F> is used as the input of NOR gate 702_3, and if any of elements page<8> and page<F> of the page width select signals is in a high level, a high level is outputted to a node ND73, while if all elements page<8> and page<F> of the page width select signal are in a low level, the signal outputted from the address transition detector 704_3 is outputted through the node ND73 as an address transition detection signal atdb. Finally, in the address transition detection block 404_3, the page width select signal page<F> is used as the input of NOR gate 702_4, and if the signal page<F> is in a high level, a high level is outputted to a node ND74, while if it is in a low level, the signal outputted from the address transition detector 704_4 is outputted through the node ND74 as an address transition detection signal atdb.

Figure 8:
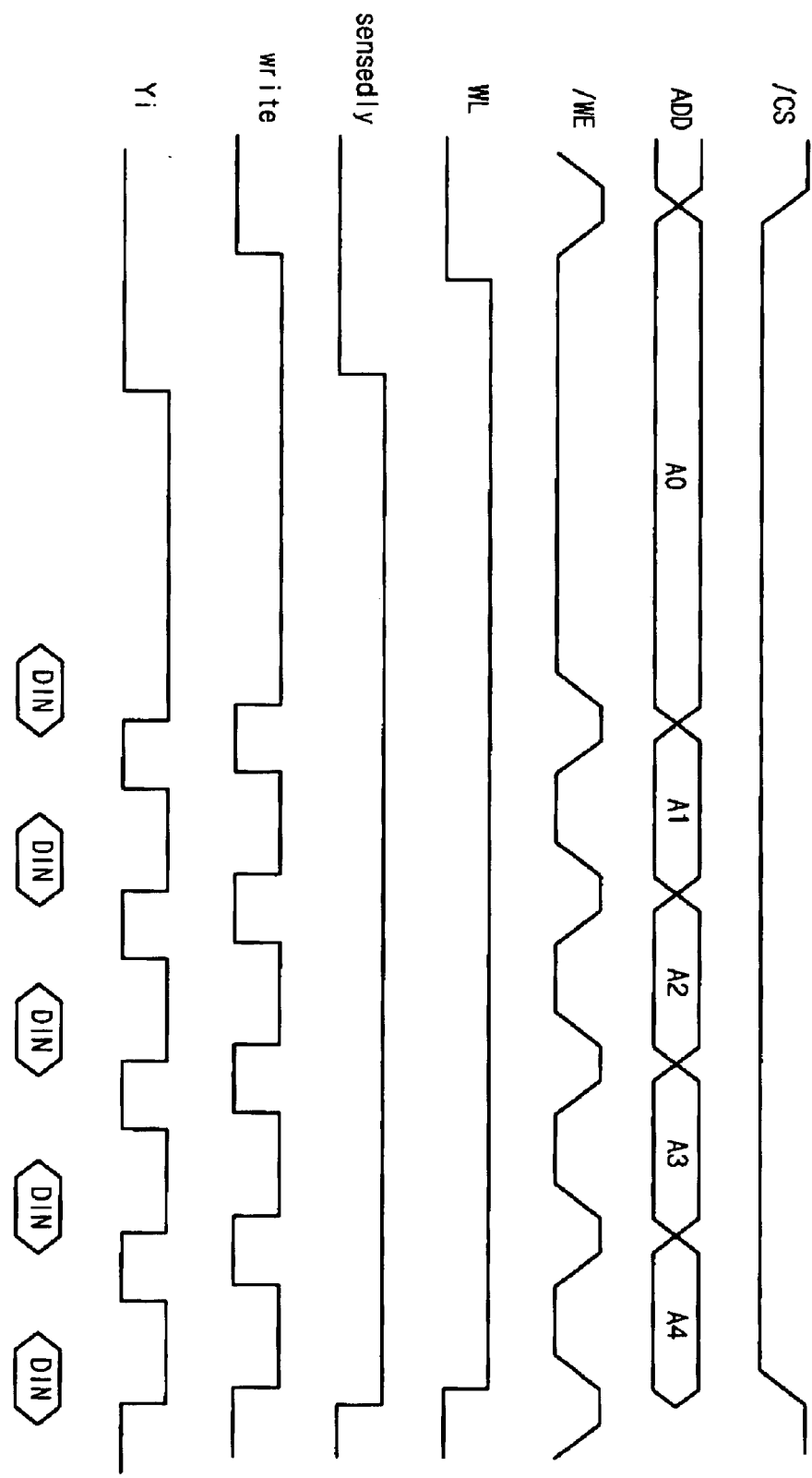
FIG. 8 is a signal waveform diagram explaining an operation of a word line and a column select signal in a page write mode according to the present invention.

FIG. 8 is a signal waveform diagram explaining an operation of a word line WL and a column select signal Yi in a page write mode according to the present invention. As shown in FIG. 8, if the chip select signal /CS becomes low, the word line WL is enabled. The first column select signal Yi is operated when the sense delay signal sensedly is operated. Next, if the write command signal is transited from a low level to a high level in a state that the sense delay signal sensedly is in a high level, the column select signal is operated. Since input data in the SRAM is effective when the write enable signal /WE is disabled, the column select signal Yi is in the same level as the write enable signal /WE, and the write operation is performed until the write enable signal /WE is disabled.

Figure 9:
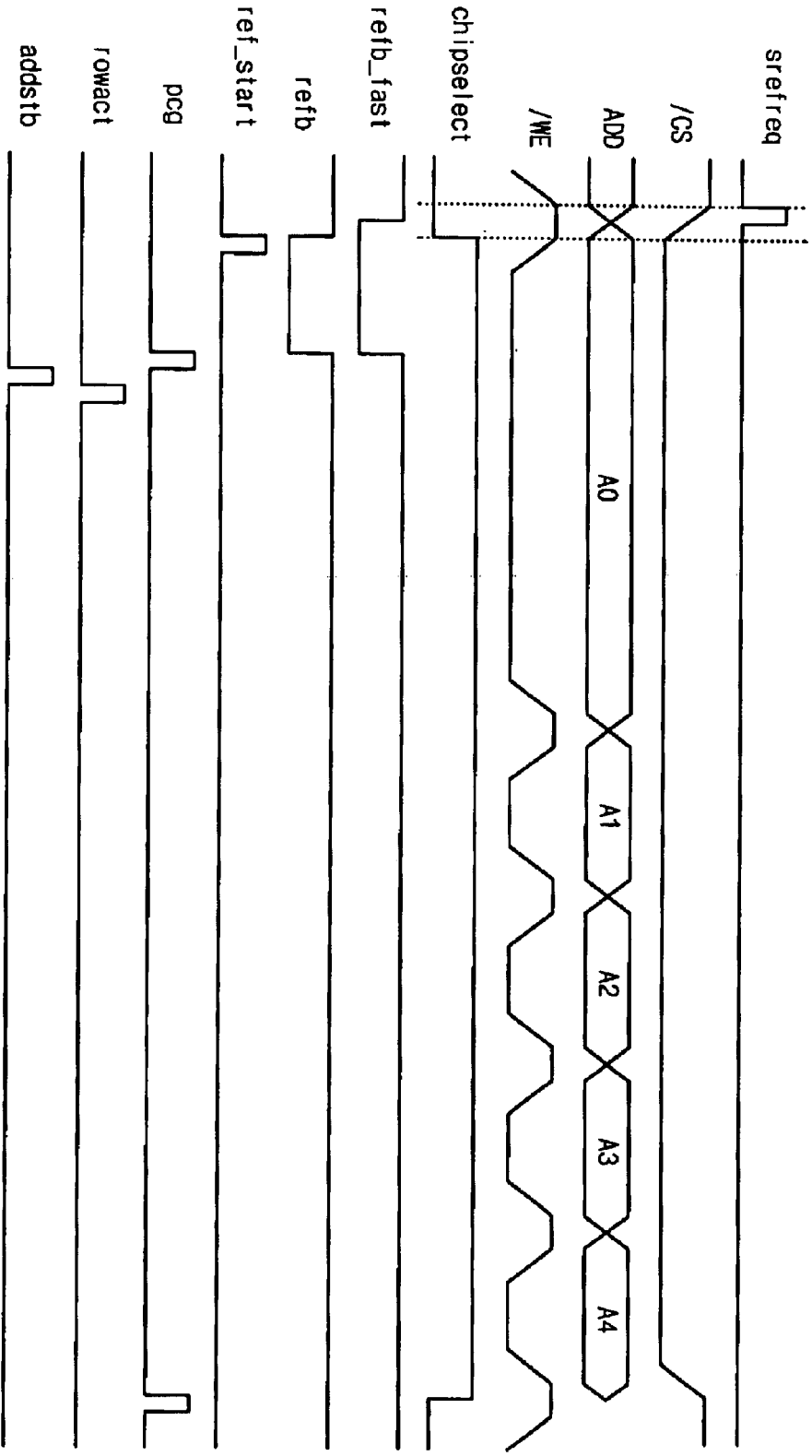
FIG. 9 is a signal waveform diagram in case that a refresh operation is performed prior to a write operation according to the present invention.

FIG. 9 is a signal waveform diagram in case that a refresh operation is performed prior to a write operation according to the present invention. If the self-refresh request signal is inputted faster than the chip select signal chipselect, the refresh is first performed, and then the write operation is performed. The signal refb_fast serves to prevent the row activation signal rowact in the row activation section (330 in FIG. 3) from being enabled faster than the refresh start signal ref_start, and simultaneously to prevent the refresh start signal ref_start and the row activation signal rowact from being simultaneously operated. The signal refb makes the pre-charge control signal pcg along with the sense delay signal in the pre-charge control section (332 in FIG. 3), and when the pre-charge control signal pcg is operation, the row activation signal rowact is also operated in the row activation section (330 in FIG. 3).

Figure 10:
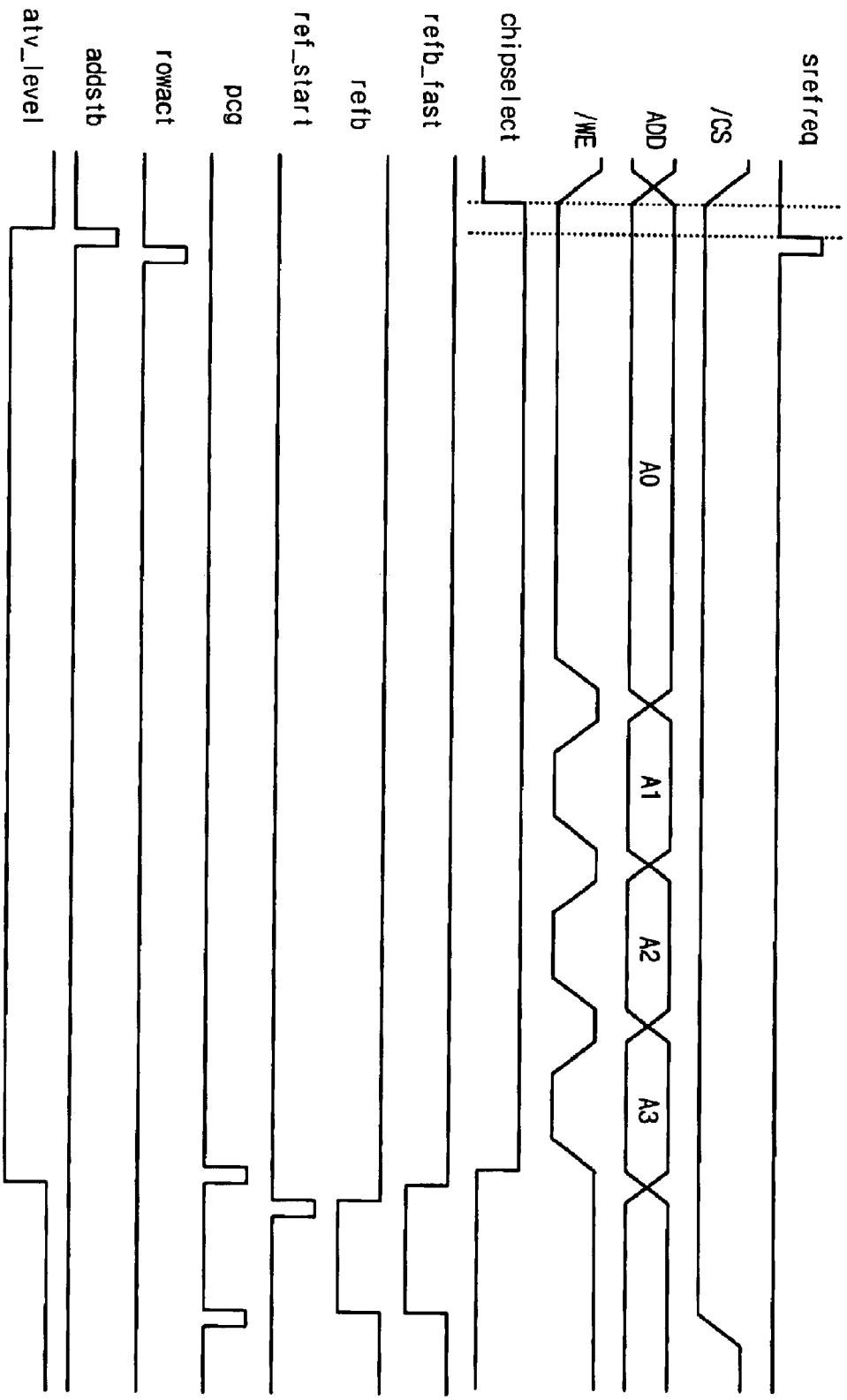
FIG. 10 is a signal waveform diagram in case that a refresh operation is performed after a write operation according to the present invention.

FIG. 10 is a signal waveform diagram in case that a refresh operation is performed after a write operation according to the present invention. If the self-refresh request signal srefreq is operated later than the chip select signal, the write operation is first performed, and if the pre-charge control signal is operated after the write operation, the refresh operation is then performed. At this time, the signal atv_level is provided to the refresh control section 326 to prevent the refresh start signal from being operated.

Figure 11A:
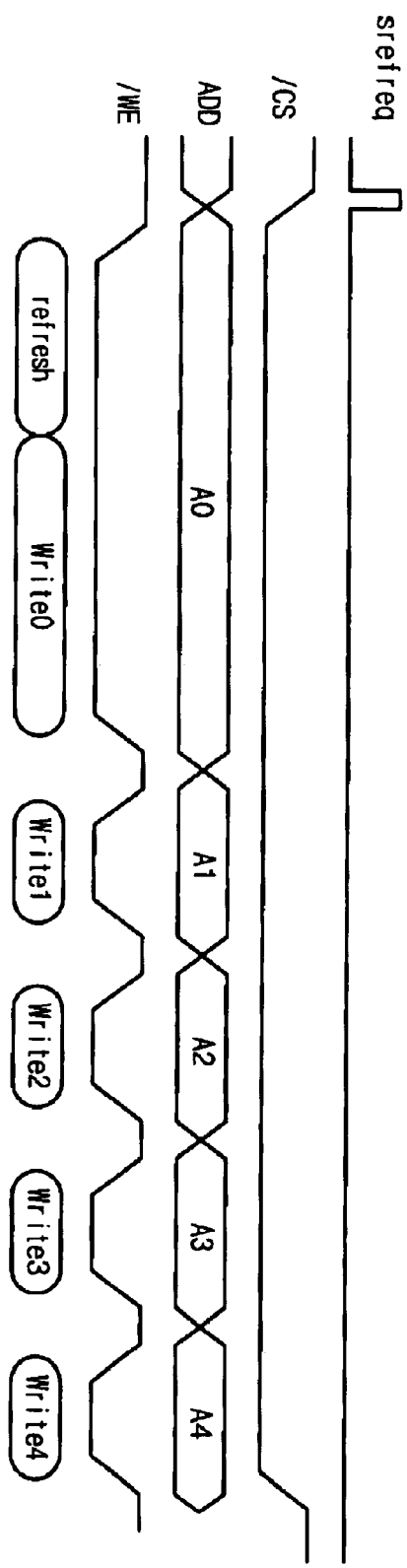
FIGS. 11A to 11C illustrate signal waveform diagrams explaining a page write mode having a refresh operation according to the present invention.
Figure 11B:
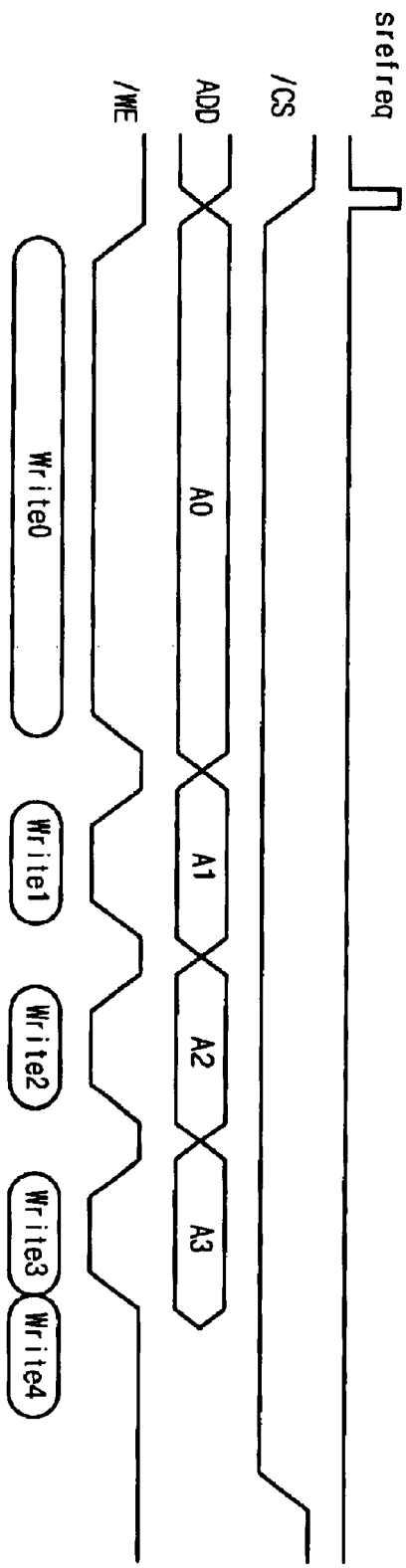
Figure 11C:
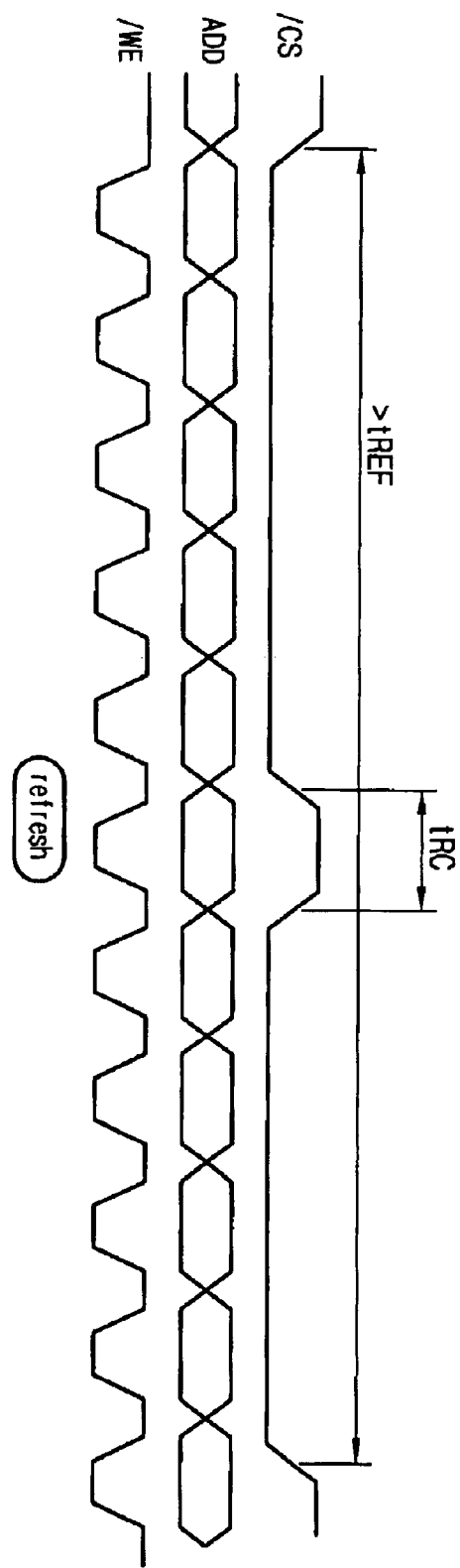

FIGS. 11A to 11C illustrate signal waveform diagrams explaining the page write timing having a refresh operation according to the present invention. FIG. 11A shows the case that the self-refresh request signal srefreq is operated faster than the chip select signal and the refresh operation is first performed prior to the write operation, FIG. 11B shows the case that the self-refresh request signal srefreq is operated later than the chip select signal and the refresh operation is performed after the write operation, and FIG. 11C shows a long write mode in that the setup page width is wide, and the write operation is performed through a long column after once the row activation. In case of the long write mode, if the write period is longer than or equal to the refresh period, a period in which the chip select signal is in a low level should be given as long as the read cycle time tRC, and at this time, the refresh operation is performed. This operation is shown in FIG. 11C.

Figure 12:
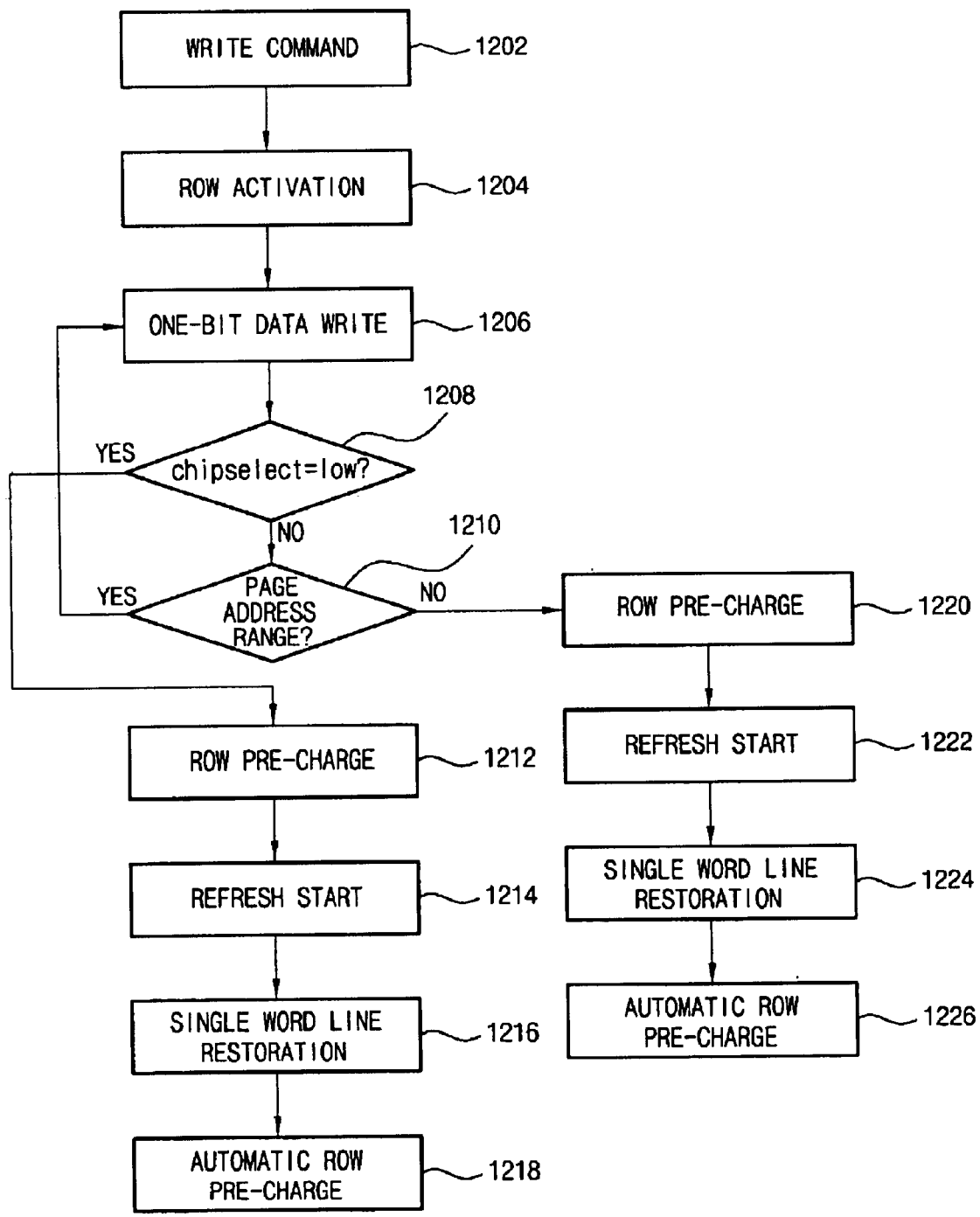
FIG. 12 is a flowchart illustrating an operation of a pseudo SRAM in case that a write operation is performed prior to a refresh operation according to the present invention.

FIG. 12 is a flowchart illustrating the operation of the pseudo SRAM in case that the write operation is performed prior to the refresh operation according to the present invention. As shown in FIG. 12, in case that the write command signal is operated faster than the self-refresh request signal srefreq and the write operation is performed prior to the refresh operation, the row corresponding to the address signal is activated according to the reception (step 1202) of the write command (step 1204), and the write operation is performed for one bit (step 1206). If the chip select signal is still in a high level and the next address is within the predetermined page width, the enable state of the word line is continuously maintained, and the data is written in the cell corresponding to the next address (steps 1208, 1210 and 1206). If the chip select signal is in a high level and the next address is outside the predetermined page width, the row pre-charge is performed (steps 1208, 1210 and 1220), the refresh operation is performed, and then the row corresponding to the next address is activated (steps 1222, 1224, 1226 and 1204). Meanwhile, if the chip select signal chipselect is in a low level, the row pre-charge is performed (steps 1208 and 1212), and then the refresh operation is performed (steps 1214, 1216 and 1218). The refresh operation, though it will not be explained in detail, passes through a refresh start (steps 1214 and 1222), single word line restoration (steps 1216 and 1224), and automatic row pre-charge (steps 1218 and 1226).

Figure 13:
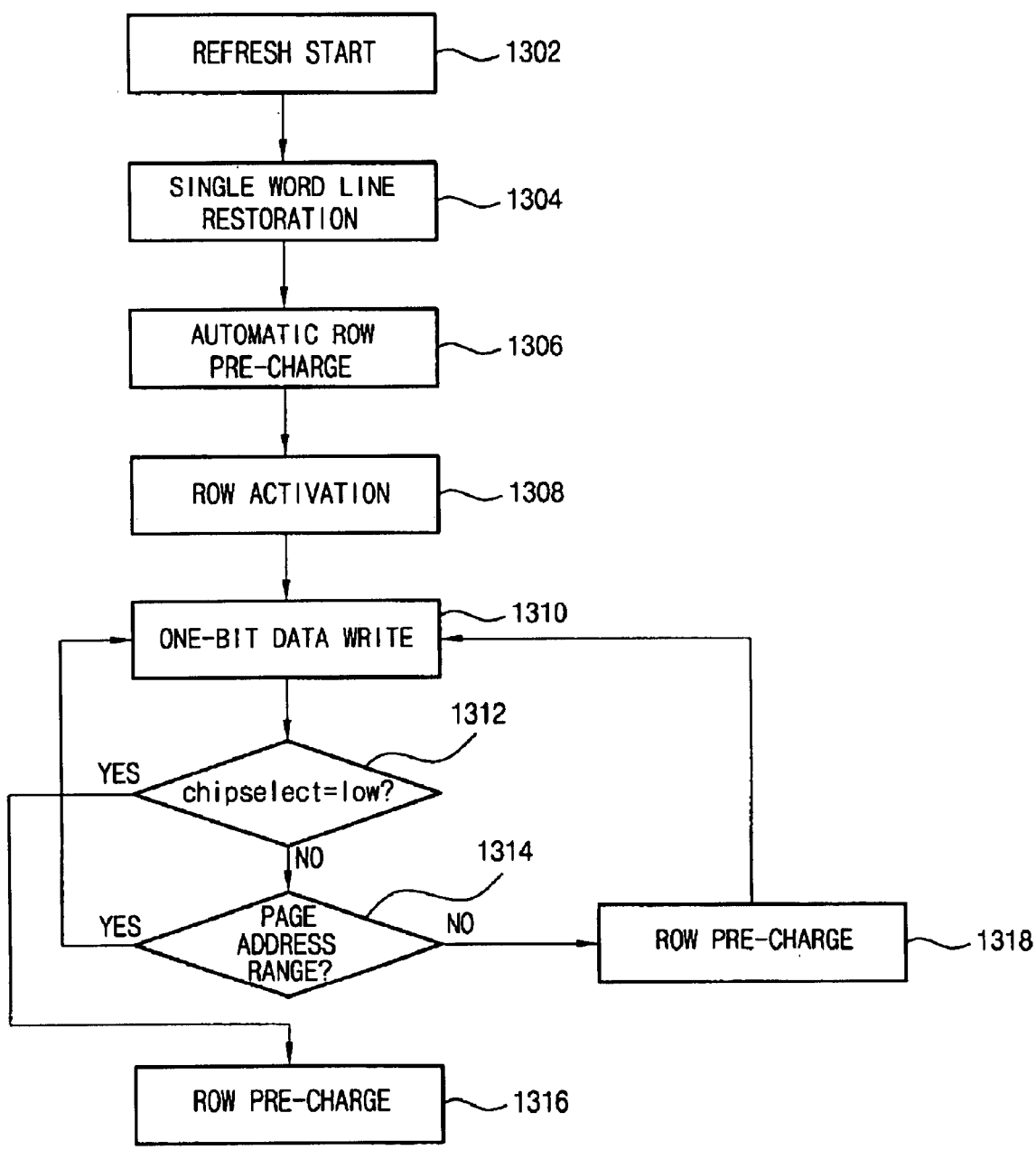
FIG. 13 is a flowchart illustrating an operation of a pseudo SRAM in case that a refresh operation is performed prior to a write operation according to the present invention.

FIG. 13 is a flowchart illustrating the operation of the pseudo SRAM in case that the refresh operation is performed prior to the write operation according to the present invention. As shown in FIG. 13, in case that the write command signal is operated later than the self-refresh request signal srefreq and the write operation is performed later than the refresh operation, the refresh operation is first performed (steps 1302, 1304 and 1306). Then, the row corresponding to the address signal is activated (step 1308), and one-bit data is written in the corresponding cell (step 1310). If the chip select signal is still in a high level and the next address is within the predetermined page width, the enable state of the word line is continuously maintained, and the data is written in the cell corresponding to the next address (steps 1312, 1314 and 1310). If the chip select signal chipselect is in a high level and the next address is outside the predetermined page width, the row pre-charge is performed (steps 1312, 1314 and 1318). Meanwhile, if the chip select signal is in a low level, the row pre-charge is performed (steps 1312 and 1316).

As described above, according to the present invention, the page write mode can be performed even in a state that the cell array of the SRAM is constructed by cells of the dynamic RAM, a large-capacity and high-speed data write can be performed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A pseudo SRAM capable of performing a page write mode, comprising:

a memory cell array composed of cells of a dynamic RAM;

a page width setup section for generating a page width select signal according to a set page width, including a plurality of option pads for generating the page width select signal depending on whether the respective pads are connected to a power supply voltage or a ground voltage;

a refresh control section for performing a refresh of the memory cell array by generating a refresh request signal at predetermined refresh intervals; and an operation control section for receiving an address signal, a data signal, and a write enable signal from an outside, receiving the page width select signal from the page width setup section, and the refresh request signal from the refresh control section, the operation control section, if the received address signal corresponds to the page width according to the page width select signal, controlling the refresh control section so that the refresh operation is not performed as keeping a specified row of the memory cell array activated by a previous address signal in an activation state, and performing a page write operation for writing the received data signal in columns of the memory cell array corresponding to the address signal according to a transition of the write enable signal.

2. The pseudo SRAM as claimed in claim 1, wherein the operation control section, if reception of the refresh request signal from the refresh control section precedes reception of the write enable signal from the outside, makes the refresh operation first performed with respect to the memory cell array, and then performs a write operation.

3. The pseudo SRAM as claimed in claim 1, wherein the operation control section, if reception of the write enable signal from the outside precedes reception of the refresh request signal from the refresh control section, first performs a write operation with respect to the memory cell array, and then makes the refresh operation performed.

4. The pseudo SRAM as claimed in claim 3, wherein the operation control section makes the page write operation continuously performed for a time period shorter than a period of the refresh operation.

5. The pseudo SRAM as claimed in claim 3, wherein the operation control section further receives from the outside a chip select signal having a first level for enabling the pseudo SRAM and a second level for disabling the pseudo SRAM, and a duration of the second level is longer than a sum of a refresh cycle time and a single write cycle time.

6. The pseudo SRAM as claimed in claim 5, wherein if the address signal received from the outside is outside the page width when the chip select signal has the first level, the operation control section newly activates the row corresponding to the received address signal, and then performs the write operation.

7. The pseudo SRAM as claimed in claim 1, wherein a time tWC required for recording a first data signal after the specified row of the memory cell array is activated by the operation control section is longer than a sum of a refresh cycle time and a single write time.

8. The pseudo SRAM as claimed in claim 1, wherein the page width setup section sets the page width as one selected among a group consisting of 2, 4, 8, and full pages.

9. The pseudo SRAM as claimed in claim 1, wherein the pseudo SRAM includes predetermined parameters for the values of tPWC, tPCW, tPAW and tPWP as AC characteristics.

10. A pseudo SRAM capable of performing a page write mode comprising:

a memory cell array composed of cells of a dynamic RAM;

a buffer enable block for receiving an external chip select signal, and generating a buffer enable signal and an internal chip select signal;

a write enable signal buffer section for receiving an external write enable signal, and generating a write command signal;

a page width setup section for generating a page width select signal according to a set page width;

a refresh control section for performing a refresh of the memory cell array by generating a refresh request signal at predetermined refresh intervals;

a page address strobe signal generating section for generating a page address strobe signal if the write command signal has a specified transition at a pre-chargeable time point after a row activation of the cell array;

a data buffer section for receiving an external data signal if the buffer enable signal is received, and generating an internal data signal;

an address buffer section for receiving an external address signal if the buffer enable signal is received and generating an internal address signal, latching the internal address signal according to the page address strobe signal, and generating no address transition detection signal if the generated internal address signal is within the page width according to the page width select signal, while generating an address transition detection signal if the generated internal address signal is outside the page width;

an input/output control section for receiving the internal address signal, the internal data signal, the write command signal, the internal chip select signal, the refresh request signal, and the page width select signal, the input/output control section, if the internal address signal corresponds to the page width according to the page width select signal, controlling the refresh control section so that the refresh operation is not performed as keeping the specified row activation state of the memory cell array activated by the previous address signal, and performing a page write operation for writing the internal data signal in columns of the memory cell array corresponding to the internal address signal according to the transition of the write command signal; and a pre-charge control section for pre-charging the input/output control section if the address transition detection signal is received.

11. The pseudo SRAM as claimed in claim 10, wherein the input/output control section, if reception of the refresh request signal from the refresh control section precedes reception of the write enable signal from the outside, makes the refresh operation first performed with respect to the memory cell array, and then performs a write operation.

12. The pseudo SRAM as claimed in claim 10, wherein the input/output control section, if reception of the write enable signal from the outside precedes reception of the refresh request signal from the refresh control section, first performs a write operation with respect to the memory cell array, and then makes the refresh operation performed.

13. The pseudo SRAM as claimed in claim 12, wherein the input/output control section makes the page write operation continuously performed for a time period shorter than a period of the refresh operation.

14. The pseudo SRAM as claimed in claim 12, wherein the input/output control section further receives from the outside a chip select signal having a first level for enabling the pseudo SRAM and a second level for disabling the pseudo SRAM, and a duration of the second level is longer than a sum of a refresh cycle time and a single write cycle time.

15. The pseudo SRAM as claimed in claim 10, wherein a time tWC required for recording a first data signal after the specified row of the memory cell array is activated by the input/output control section is longer than a sum of a refresh cycle time and a single write time.

16. A method of performing a method of performing a page write mode in a pseudo SRAM having a memory cell array composed of cells of a dynamic RAM, comprising:

a first step of first performing a refresh operation of the memory cell array, and then performing a write operation if generation of a refresh request signal precedes generation of a write command signal; and a second step of first performing the write operation of the memory cell array, and then performing the refresh operation if the generation of the write command signal precedes the generation of the refresh request signal.

17. The method as claimed in claim 16, wherein the write operation comprises:

a first substep of first writing one-bit data in a corresponding cell after performing activation of a specified row of the memory cell array by the write command signal;

a second substep of writing the data in the cell corresponding to a next address signal as keeping the activation state of the activated row if a next address signal received from the outside is within a predetermined page width; and a third substep of writing the corresponding data by activating the row of the memory cell array corresponding to the next address after performing the refresh operation of the memory cell array if the next address is outside the page width.

18. The method as claimed in claim 17, wherein a time required for the first substep is larger than a sum of a refresh cycle time and a single write cycle time.

19. The method as claimed in claim 17, wherein the second substep is continuously performed only for a time smaller than the refresh period.

20. The pseudo SRAM as claimed in claim 1, further comprising:

an page address strobe generating section controlled by a power-up signal and sense delay signal, and generating a page address strobe signal when a write commend signal is activated.

* * * * *